(12) United States Patent
Wang et al.

(10) Patent No.: US 11,987,734 B2
(45) Date of Patent: May 21, 2024

(54) ANTI-PID ENCAPSULATION ADHESIVE FILM, PHOTOVOLTAIC MODULE, AND PHOTOVOLTAIC MODULE MANUFACTURING METHOD

(71) Applicant: HANGZHOU FIRST APPLIED MATERIAL CO., LTD., Zhejiang (CN)

(72) Inventors: Haonan Wang, Zhejiang (CN); Mingjie Cao, Zhejiang (CN); Yan Sang, Zhejiang (CN); Hongbing Hou, Zhejiang (CN); Wei Deng, Zhejiang (CN); Yunxiao Mei, Zhejiang (CN); Dayue Jin, Zhejiang (CN); Chufeng Yang, Zhejiang (CN)

(73) Assignee: HANGZHOU FIRST APPLIED MATERIAL CO., LTD., Zhejiang (CN)

( * ) Notice: Subject to any disclaimer, the term of this patent is extended or adjusted under 35 U.S.C. 154(b) by 0 days.

(21) Appl. No.: 18/011,193

(22) PCT Filed: May 20, 2021

(86) PCT No.: PCT/CN2021/094955
§ 371 (c)(1),
(2) Date: Dec. 19, 2022

(87) PCT Pub. No.: WO2022/001467
PCT Pub. Date: Jan. 6, 2022

(65) Prior Publication Data
US 2023/0235197 A1    Jul. 27, 2023

(30) Foreign Application Priority Data

Jun. 29, 2020 (CN) .......................... 202010605207.7
Aug. 11, 2020 (CN) .......................... 202010802935.7

(51) Int. Cl.
*H01L 31/048* (2014.01)
*C09J 7/29* (2018.01)
(Continued)

(52) U.S. Cl.
CPC .......... *C09J 7/29* (2018.01); *H01L 31/02008* (2013.01); *H01L 31/0481* (2013.01);
(Continued)

(58) Field of Classification Search
CPC ......... H01L 31/02008; H01L 31/02021; H01L 31/048; H01L 31/0481; H01L 31/05;
(Continued)

(56) References Cited

U.S. PATENT DOCUMENTS

2010/0031996 A1* 2/2010 Basol .................. B32B 37/1018
156/308.2
2015/0280039 A1  10/2015 Ebfoil

FOREIGN PATENT DOCUMENTS

CN    108495472 A    9/2018
CN    108615774 A    10/2018
(Continued)

OTHER PUBLICATIONS

English machine translation of Liu et al. (CN 208240701) published Dec. 14, 2018.*

*Primary Examiner* — Christina Chern
(74) *Attorney, Agent, or Firm* — Samson G. Yu

(57) ABSTRACT

The present disclosure provides an anti-PID encapsulation adhesive film, a photovoltaic module, and a photovoltaic module manufacturing method. The anti-PID encapsulation adhesive film includes a base adhesive film layer, an insulating layer, and a conductive layer. The insulating layer is located on one side surface of the base adhesive film layer. The insulating layer has a grid structure. The grid structure includes grid lines and a plurality of hollow portions defined (Continued)

by the grid lines. The grid lines have a structure corresponding to gaps between cell pieces. The conductive layer includes a plurality of conductive portions. The conductive portions are arranged in the hollow portions in one-to-one correspondence. The volume resistivity of the conductive portions is less than 100 Ω·cm.

9 Claims, 5 Drawing Sheets

(51) Int. Cl.
*H01L 31/02* (2006.01)
*H01L 31/05* (2014.01)
*H02S 40/38* (2014.01)

(52) U.S. Cl.
CPC ..... *H01L 31/0504* (2013.01); *C09J 2203/326* (2013.01); *C09J 2301/122* (2020.08); *C09J 2301/162* (2020.08); *C09J 2301/41* (2020.08); *H02S 40/38* (2014.12)

(58) Field of Classification Search
CPC ............. H01L 31/0465; H01L 31/0504; H01L 31/0508; H01L 31/0512
See application file for complete search history.

(56) References Cited

FOREIGN PATENT DOCUMENTS

| | | | | |
|---|---|---|---|---|
| CN | 208240701 U | * | 12/2018 | ........... H01L 31/049 |
| CN | 109337599 A | | 2/2019 | |
| CN | 109994564 A | | 7/2019 | |
| CN | 209895783 U | | 1/2020 | |
| CN | 210110805 U | | 2/2020 | |
| CN | 111081802 A | | 4/2020 | |
| CN | 111205788 A | | 5/2020 | |
| CN | 210443574 U | | 5/2020 | |
| CN | 111704866 A | | 9/2020 | |
| CN | 111883604 A | | 11/2020 | |
| JP | 2011049612 A | | 3/2011 | |
| WO | 2014068496 A2 | | 5/2014 | |

* cited by examiner

ANTI-PID ENCAPSULATION ADHESIVE FILM, PHOTOVOLTAIC MODULE, AND PHOTOVOLTAIC MODULE MANUFACTURING METHOD

CROSS-REFERENCE TO RELATED APPLICATION

The present application is based upon and claims priority to CN applications No. 202010605207.7, filed on Jun. 29, 2020 and No. 202010802935.7, filed on Aug. 11, 2020, the disclosures of which are hereby incorporated by reference in their entirety.

TECHNICAL FIELD

The present disclosure relates to the field of photovoltaic, and in particular to an anti-Potential Induced Degradation (PID) encapsulation adhesive film, a photovoltaic module, and a photovoltaic module manufacturing method.

BACKGROUND

Crystalline silicon cell modules face long-term stability and reliability challenges during normal service, eventually leading to power degradation. PID is relatively severe. For conventional aluminum back-field cell modules, it is generally recognized in the industry that the reason for PID is the migration of metallic sodium ions, and therefore, the migration of sodium ions can be blocked by enhancing the density of an encapsulation adhesive film, thereby reducing the risk of PID failure of the modules. In recent years, double-sided batteries have become a trend, especially double-sided PERC batteries. PID at the back thereof presents a greater challenge to the encapsulation adhesive film. Conventional anti-PID encapsulation adhesive films have not been able to meet the needs of current double-sided PERC cell modules. Passivation of AlOx on the back of a double-sided PERC cell is critical for high efficiency, but under the influence of potential, positive charges will be enriched on the back, and negative charges of AlOx will be neutralized, resulting in deactivation failure. Therefore, there is a need to develop an encapsulation adhesive film that can effectively solve the problem of charge enrichment.

Currently, anti-PID adhesive films commonly employ a method of adding an ion or charge trapping agent to a base resin, so that relevant ions or charges are trapped during the migration process and cannot reach the surface (back) of a cell, thereby preventing the accumulation of charges on the surface of the cell. However, the selection of relevant materials is not so easy, not only the ion trapping ability is required, but also the compatibility with a base resin, the influence on the light transmittance of the base resin and the influence on the aging performance of the base resin are required to be concerned. Meanwhile, the incorporation of relevant ion or charge trapping agents into an adhesive film can only trap ions or charges migrating into the adhesive film, and those ions or charges remaining on the surface of the cell or largely passing through the adhesive film are not trapped, or the trapping capacity is limited and is not complete enough.

For the above reasons, it is necessary to provide an anti-PID encapsulation adhesive film having a better treatment effect on ions or charges remaining on the surfaces of cell pieces or largely passing through the adhesive film.

With the continuous development of photovoltaic modules today, it is not only necessary to continuously increase the efficiency of photovoltaic modules, but also necessary to make efforts towards lightweight photovoltaic modules. Upon the weight reduction of part of the photovoltaic module, a considerable help can be provided for the production and transportation of the photovoltaic module, the installation and maintenance, the specification requirements of a photovoltaic power station support, wind resistance, etc.

The weight aspect of the photovoltaic module depends on several elements of photovoltaic glass, encapsulation adhesive films, silicon wafers, solder strips (interconnect and bus bars), backplanes, and frames. The weight of photovoltaic glass depends on the thickness, and cannot be reduced excessively under the premise of ensuring performance. Similarly, the weight of encapsulation adhesive films, silicon wafers and backplanes cannot be reduced excessively.

SUMMARY

A main object of the present disclosure is to provide an anti-PID encapsulation adhesive film and a photovoltaic module, so as to solve the PID problem of photovoltaic modules caused by ions or charges remaining on the surfaces of cell pieces or largely passing through adhesive films in the conventional art.

In order to achieve the above object, according to one aspect of the present disclosure, an anti-PID encapsulation adhesive film is provided, which may include a base adhesive film layer, an insulating layer, and a conductive layer. The insulating layer is located on one side surface of the base adhesive film layer. The insulating layer has a grid structure. The grid structure includes grid lines and a plurality of hollow portions defined by the grid lines. The grid lines have a structure corresponding to gaps between cell pieces. The conductive layer includes a plurality of conductive portions. The conductive portions are arranged in the hollow portions in one-to-one correspondence. The volume resistivity of the conductive portions is less than 100 Ω·cm.

Further, the width of the grid lines is greater than the width of the gaps between the cell pieces.

Further, the surface of a side of the conductive portion away from the base adhesive film layer has a shape adapted to the surfaces of the cell pieces, and the surface edge of the side of the conductive portion away from the base adhesive film layer is flush with the surface of the insulating layer.

Further, the conductive layer has a thickness of 5-50 μm.

Further, the conductive layer includes a resin base material and a conductive filler dispersed in the resin base material.

Further, the conductive filler is one or more of carbon nanotubes, nano-silver powder, nano-silver wire, silver-coated copper particles, or silver-coated nickel particles.

Further, the weight of the conductive filler is 0.5-20% of the weight of the resin base material.

Further, the materials of the insulating layer and the base adhesive film layer are independently selected from one or more of EVA, POE, and PVB, respectively.

Further, the insulating layer and the base adhesive film layer are of an integrated structure.

Further, a side of the grid line away from the base adhesive film layer further has a plurality of pits, conductive materials are arranged in the pits in one-to-one correspondence, and the conductive materials are in contact with cell pieces to be arranged above the conductive layer. Preferably, the depth of the pits is 30-300 μm, and the thickness of the conductive materials arranged in the pits is 20-650 μm.

According to another aspect of the present disclosure, a photovoltaic module is also provided, which may include an encapsulation adhesive film and cell pieces. The encapsulation adhesive film is the above anti-PID encapsulation adhesive film, and grid lines in an insulating layer in the anti-PID encapsulation adhesive film are arranged correspondingly to gaps between the cell pieces.

Further, a side of the grid line away from the base adhesive film layer further has a plurality of pits, conductive materials are arranged in the pits in one-to-one correspondence, and the conductive materials are in contact with cell pieces to be arranged above the conductive layer. Preferably, the depth of the pits is 30-300 μm, and the thickness of the conductive materials arranged in the pits is 20-650 μm.

Further, there are a plurality of cell pieces, the plurality of cell pieces are divided into at least one group of cell strings, each of the cell strings includes a plurality of cell pieces, the cell pieces in each cell string are connected by interconnection bars, and the conductive materials arranged in the pits are connected to each interconnection bar at least partially.

The present disclosure provides an anti-PID encapsulation adhesive film, including a base adhesive film layer, an insulating layer, and a conductive layer. The insulating layer is located on one side surface of the base adhesive film layer. The insulating layer has a grid structure. The grid structure includes grid lines and a plurality of hollow portions defined by the grid lines. The grid lines have a structure corresponding to gaps between cell pieces. The conductive layer includes a plurality of conductive portions. The conductive portions are arranged in the hollow portions in one-to-one correspondence. The volume resistivity of the conductive portions is less than 100 Ω·cm. According to the encapsulation adhesive film, in actual assembly, the insulating layer is arranged in contact with cell pieces in a photovoltaic module. Since the grid lines have a structure corresponding to gaps between the cell pieces, the conductive portions are arranged in the hollow portions in one-to-one correspondence, and thus, after the assembly is completed, the cell pieces and the conductive portions correspond in structure and are arranged in one-to-one correspondence. The grid lines are correspondingly arranged below the gaps between the cell pieces, so as to form insulation between the conductive portions and the cell pieces. Ions or charges enriched on the surfaces of the cell pieces or passing through the adhesive film can be delivered away by means of the conductive portions, thereby directly eliminating charges causing failure of the passivation layer. Thus, the PID problem thereof can be more effectively improved without affecting the remaining performance of the photovoltaic module.

In order to reduce the weight of photovoltaic modules in the conventional art, according to one aspect of the present disclosure, a photovoltaic module is provided, which may include: a first transparent substrate, a first encapsulation adhesive layer, a cell piece layer, a second encapsulation adhesive layer, and a second transparent substrate, which are stacked. The first encapsulation adhesive layer and/or the second encapsulation adhesive layer includes a base material layer and conductive layers. A plurality of pits are provided on one side surface of the base material layer. The conductive layers are arranged in the pits in one-to-one correspondence, and the conductive layers are in contact with the cell piece layer.

Further, the pits have a depth of 10-300 μm.

Further, the conductive layers have a thickness of 20-650 μm.

Further, conductive materials forming the conductive layers are selected from any one or more of copper foil, aluminum foil, and conductive organic and conductive inorganic compounds.

Further, conductive materials forming the conductive layers are selected from any one or more of copper foil, aluminum foil, and conductive organic and conductive inorganic compounds.

Further, the base material layer has a thickness of 290-800 μm.

Further, adhesive film materials forming the base material layer are EVA and/or POE.

Further, the cell piece layer includes a plurality of cell pieces, and the conductive layers are connected to each cell piece at least partially.

Further, the cell piece layer includes a plurality of cell strings, each of the cell strings includes a plurality of cell pieces, the cell pieces in each cell string are connected by interconnection bars, and the conductive layers are connected to each interconnection bar at least partially.

Further, the cell piece layer includes a plurality of cell strings, each of the cell strings includes a plurality of cell pieces, the conductive layer includes first conductive portions and second conductive portions, the first conductive portions are connected to the cell pieces in each cell string at least partially, and the second conductive portions are connected to each first conductive portion at least partially.

According to another aspect of the present disclosure, a manufacturing method for the above photovoltaic module is provided, which may include: a step of preparing the first encapsulation adhesive layer and/or second encapsulation adhesive layer, and a step of stacking the first transparent substrate, the first encapsulation adhesive layer, the cell piece layer, the second encapsulation adhesive layer, and the second transparent substrate. The step of preparing the first encapsulation adhesive layer and/or second encapsulation adhesive layer includes: forming a plurality of pits on one side surface of the base material layer, and arranging the conductive layer in the pits.

Further, the surface of a patterned roll is coated with a conductive material, the surface of the patterned roll has a first adhesion force to the conductive material, the patterned roll is used to form the pits in the surface of the base material layer, the conductive material is adhered to the pits at least partially to form the conductive layer while forming the pits, the base material layer has a second adhesion force to the conductive material, and the second adhesion force is greater than the first adhesion force.

Further, a conductive material is adsorbed on the surface of a patterned roll by a first adsorption force, the pits are formed on the surface of the base material layer by the patterned roll, and the adsorption of the conductive material is released while the pits are formed, so that the conductive material is transferred into the pits, or the conductive material is adsorbed on a side of the base material layer away from the patterned roll by a second adsorption force, the second adsorption force being greater than the first adsorption force.

Further, after the step of forming the pits and before the step of arranging the conductive layer in the pits, the manufacturing method further includes a step of pre-cross-linking the base material layer.

With the technical solution of the present disclosure, a photovoltaic module is provided, including: a first transparent substrate, a first encapsulation adhesive layer, a cell piece layer, a second encapsulation adhesive layer, and a second transparent substrate, which are stacked. The first encapsulation adhesive layer and/or the second encapsulation adhesive layer include a base material layer and conductive layers. Pluralities of pits are provided on one side surface of the base material layer. The conductive layers are arranged in the pits, and the conductive layers are in contact with the cell piece layer. In order to collect electric current, the photovoltaic module in the conventional art usually needs to use interconnection bars to connect cell pieces and bus bars to connect cell strings composed of cell pieces. The above interconnection bars and the bus bars are located between a cell piece layer and an encapsulation adhesive layer. However, the photovoltaic module in the present disclosure can eliminate the above interconnection bars (and/or bus bars) in the conventional art by providing a base material layer of a sealing adhesive layer with pits and arranging conductive materials in the pits and in contact with the cell piece layer, thereby reducing the type of photovoltaic modules. Moreover, the interconnection bars and bus bars in the conventional art are usually formed by plating copper cores with tin and covered on the cell piece layer by manual welding. However, the arrangement of the conductive layer in the photovoltaic module according to the present disclosure does not require a welding process, thereby not only reducing the production cost of the photovoltaic module, but also reducing the manual labor consumption during the production of the photovoltaic module. Moreover, with regard to the photovoltaic module in the conventional art, if water vapor invades the module, acetate ions and the like are easily hydrolyzed in the encapsulation adhesive film, this would have a corrosion effect on metals such as copper in a solder strip. However, the conductive layer used in the present disclosure may be an organic conductive material, so that the risk of corrosion of the module can be reduced. In addition, since the conventional solder strip bus bar may have a certain thickness, and the thickness of an encapsulation material laminated at this position may be reduced, so that the protective effect exerted by the encapsulation material may be weakened, resulting in an increased risk of corrosion. However, the conductive layer in the present disclosure is well-integrated with the adhesive film and can constitute an integrated product, so that the protective effect of the encapsulation adhesive layer on the conductive layer can be improved.

BRIEF DESCRIPTION OF THE DRAWINGS

The accompanying drawings, which constitute a part of this application, are used to provide a further understanding of the present disclosure, and the exemplary embodiments of the present disclosure and the description thereof are used to explain the present disclosure, but do not constitute improper limitations to the present disclosure. In the drawings.

Figure 1:
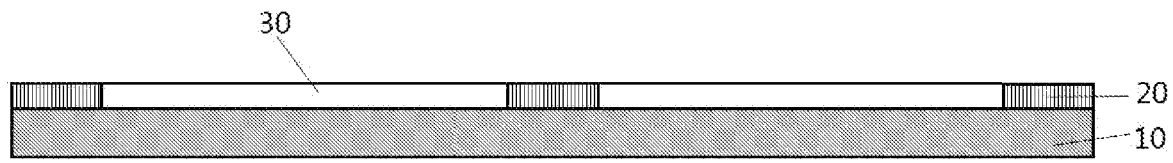
FIG. 1 shows a schematic structure diagram of an anti-PID encapsulation adhesive film according to an embodiment of the present disclosure.

The above drawings include the following reference numerals:
1, encapsulation adhesive film; 2, cell piece; 10, base adhesive film layer; 20, insulating layer; 30, conductive layer.

Figure 5:
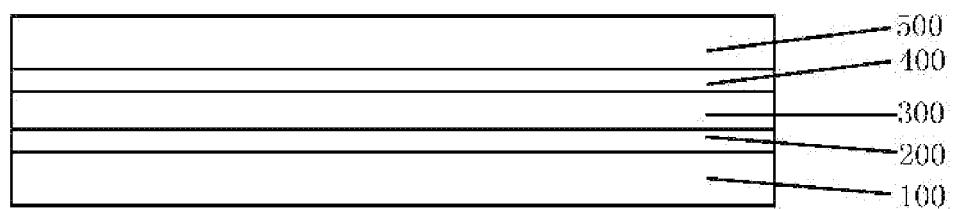

FIG. 5 shows a cross-sectional schematic structure diagram of a photovoltaic module according to an implementation of the present disclosure.

Figure 6:
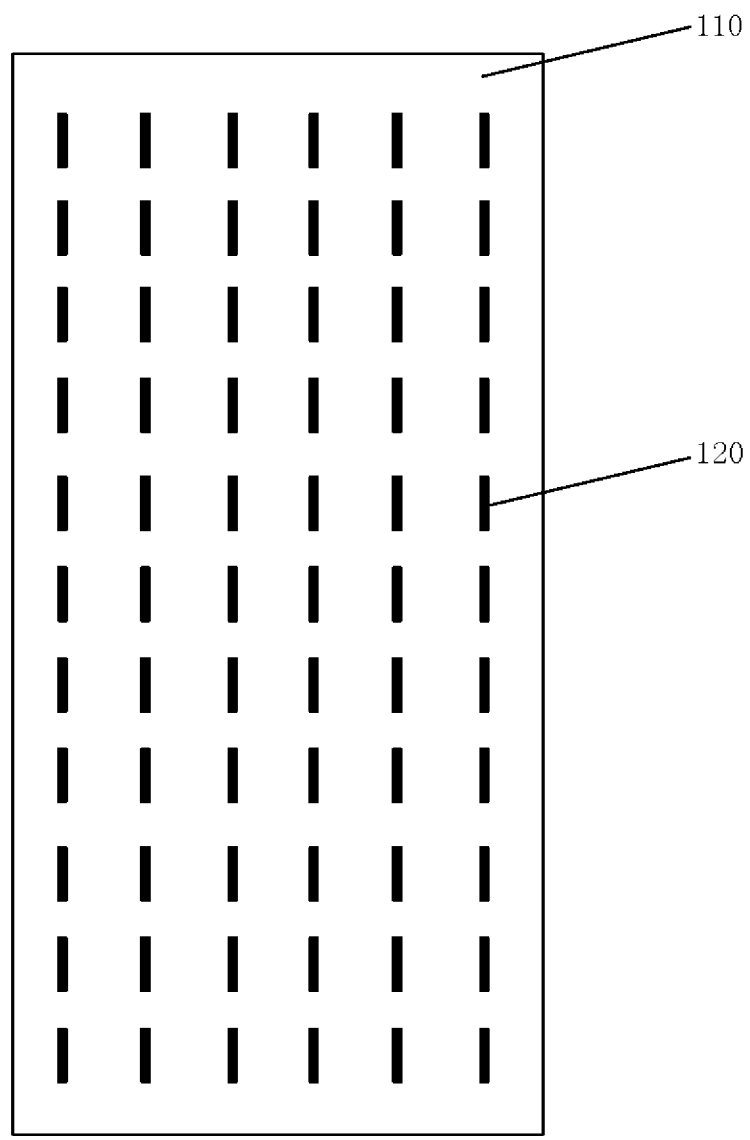

FIG. 6 shows a top-view schematic structure diagram of a first encapsulation adhesive layer (or second encapsulation adhesive layer) in the photovoltaic module shown in FIG. 5.

Figure 7:
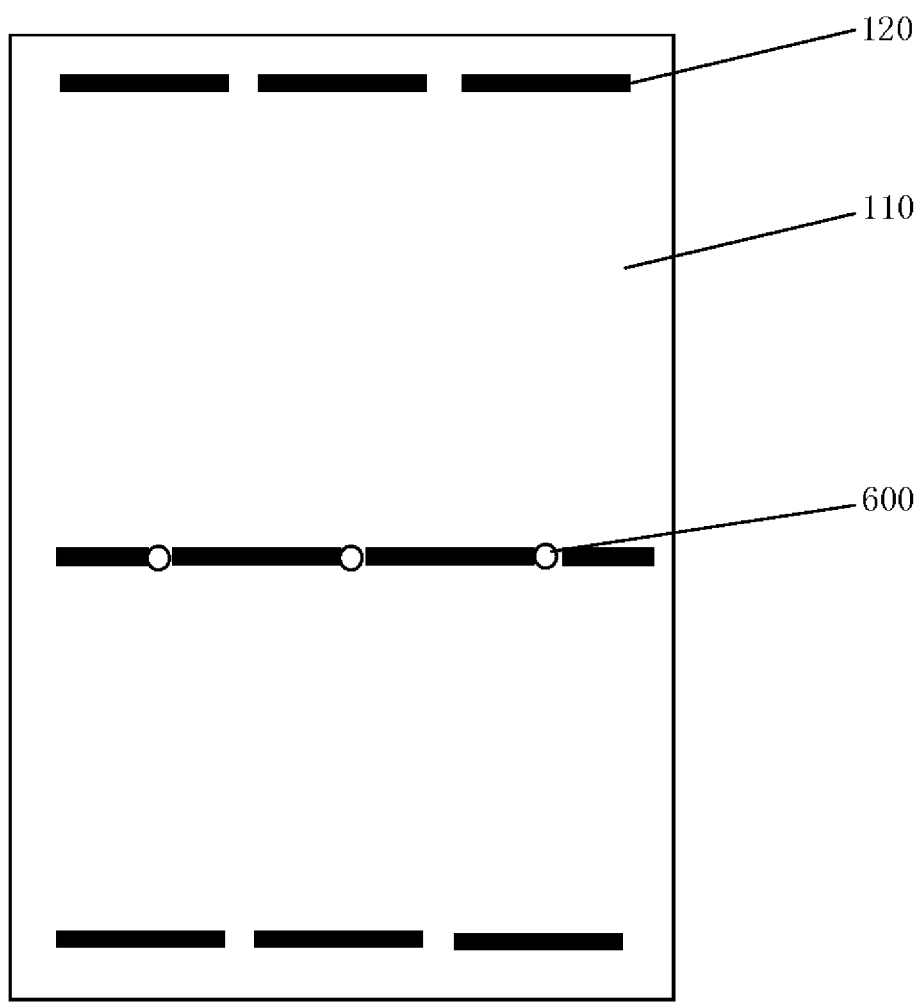

FIG. 7 shows a top-view schematic structure diagram of another first encapsulation adhesive layer (or second encapsulation adhesive layer) in the photovoltaic module shown in FIG. 5.

Figure 8:
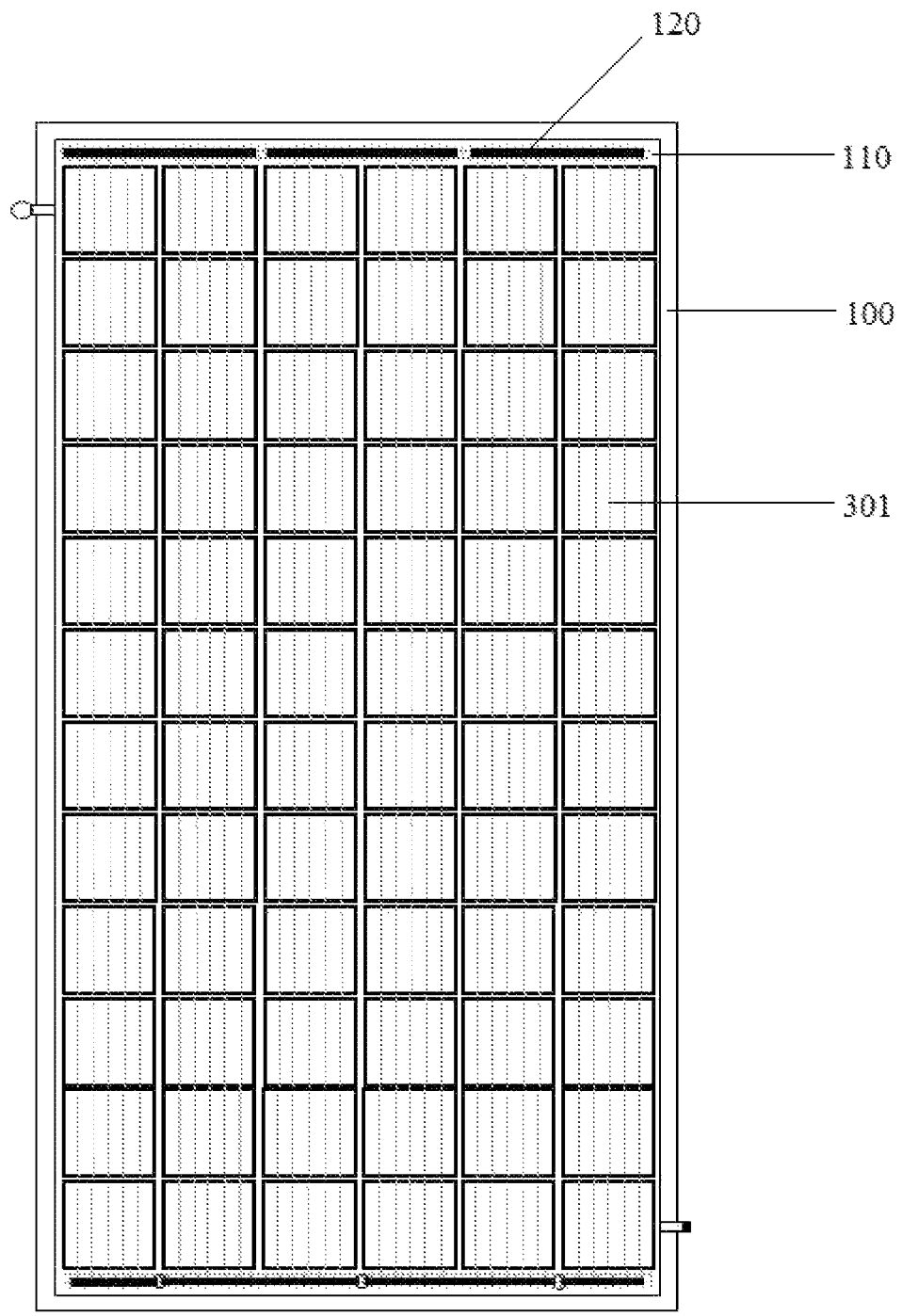

FIG. 8 shows a top-view schematic structure diagram of a first transparent substrate with a first encapsulation adhesive layer and a cell piece on the surface in the photovoltaic module shown in FIG. 5.

The above drawings include the following reference numerals:
100, first transparent substrate; 200, first encapsulation adhesive layer; 300, cell piece layer; 301, cell piece; 400, second encapsulation adhesive layer; 500, second transparent substrate; 600, first wire lead-out hole; 110, base material layer; 120, conductive layer.

DETAILED DESCRIPTION OF THE EMBODIMENTS

It should be noted that embodiments in the present application and features in the embodiments may be combined with each other without conflict. The present disclosure is described below with reference to the drawings and in conjunction with the embodiments in detail.

As described in the Background section of the present disclosure, the serious PID problem of photovoltaic modules caused by ions or charges remaining on the surfaces of cell pieces or largely passing through adhesive films in the conventional art is caused.

Figure 2:
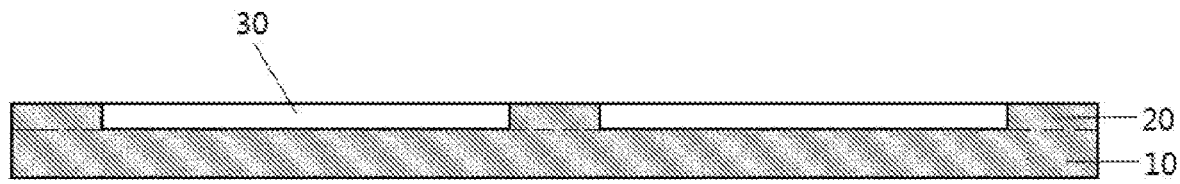
FIG. 2 shows a schematic structure diagram of an anti-PID encapsulation adhesive film according to another embodiment of the present disclosure.
Figure 3:
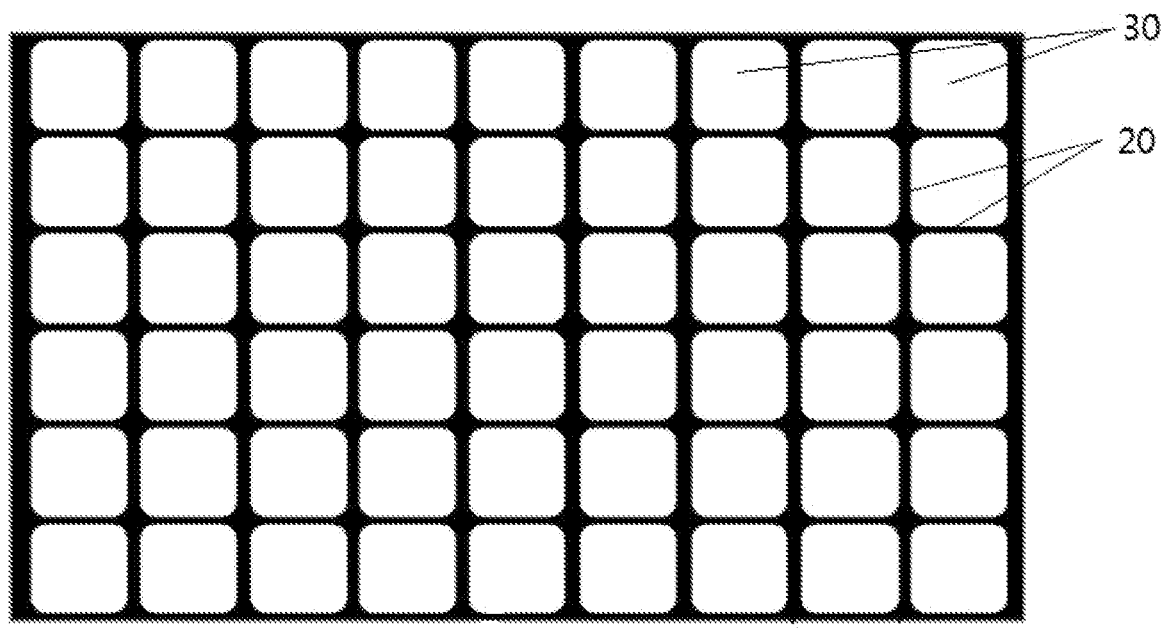
FIG. 3 shows a top view of the anti-PID encapsulation adhesive film shown in FIG. 1.

In order to solve the above problem, the present disclosure provides an anti-PID encapsulation adhesive film. As shown in FIGS. 1 and 2, the anti-PID encapsulation adhesive film includes a base adhesive film layer 10, an insulating layer 20, and a conductive layer 30. The insulating layer 20 is located on one side surface of the base adhesive film layer 10. As shown in FIG. 3, the insulating layer 20 has a grid structure. The grid structure includes grid lines and a plurality of hollow portions defined by the grid lines. The grid lines have a structure corresponding to gaps between cell pieces. The conductive layer 30 includes a plurality of conductive portions. The conductive portions are arranged in the hollow portions in one-to-one correspondence. The volume resistivity of the conductive portions is less than 100 Ω·cm.

According to the encapsulation adhesive film provided in the present disclosure, in actual assembly, the insulating layer is arranged in contact with cell pieces in a photovoltaic module. Since the grid lines have a structure corresponding to gaps between the cell pieces, the conductive portions are arranged in the hollow portions in one-to-one correspondence, and thus, after the assembly is completed, the cell pieces and the conductive portions correspond in structure and are arranged in one-to-one correspondence. The grid lines are correspondingly arranged below the gaps between the cell pieces, so as to form insulation between the conductive portions and the cell pieces. Ions or charges enriched on the surfaces of the cell pieces or passing through the adhesive film can be delivered away by means of the conductive portions, thereby directly eliminating charges causing failure of the passivation layer. Thus, the PID problem thereof can be more effectively improved without affecting the remaining performance of the photovoltaic module. The specific charge or ion delivery mechanism is as follows: the surface of the cell piece has thin gate lines and main gate lines which can conduct electricity, while the surface of regions between all the gate lines is non-conductive. Once charges are enriched on the surface, an electric field is formed, thereby affecting the passivation effect of the cell and causing PID. The conductive layer of the present disclosure primarily transfers these charges at non-conductive regions on the surface of the cell piece laterally to the gate lines through the conductive layer on the surface of the adhesive film, and finally delivers the charges away through the gate lines.

In order to further prevent short circuit problems between the cell pieces, in a preferred implementation, the width of the grid lines is greater than the width of the gaps between the cell pieces. The reliability of the encapsulation adhesive film can be further improved. More preferably, the surface of a side of the conductive portion away from the base adhesive film layer 10 has a shape adapted to the surfaces of the cell pieces, and the surface edge of the side of the conductive portion away from the base adhesive film layer 10 is flush with the surface of the insulating layer 20. This makes it possible to increase the contact area of the conductive portions with the surfaces of the cell pieces, thereby more facilitating the delivery of ions or charges on the surfaces of the cell pieces to further improve the PID effect.

For the purpose of better compromise between anti-PID performance and light transmission, in a preferred implementation, the conductive layer 30 has a thickness of 5-50 µm.

As long as the material used for the above conductive layer can satisfy the requirements of volume resistivity of less than 100 Ω·cm and transparency, in a preferred implementation, the conductive layer 30 includes a resin base material and a conductive filler dispersed in the resin base material. Preferably, the weight of the conductive filler is 0.5-20% of the weight of the resin base material. More preferably, the conductive filler is one or more of carbon nanotubes, nano-silver powder, nano-silver wire, silver-coated copper particles, or silver-coated nickel particles. The above conductive fillers have high electrical conductivity, and can ensure that the volume resistivity of the conductive layer is small on the basis of a small amount, and also help to improve the light transmittance of the overall encapsulation adhesive film. More preferably, the resin base material is one or more of acrylic resin, polyurethane, and epoxy resin.

In a preferred implementation, the materials of the insulating layer 20 and the base adhesive film layer 10 are independently selected from one or more of EVA, POE, and PVB, respectively.

The insulating layer 20 and the base adhesive film layer 10 may be two layers as shown in FIG. 1, and may be manufactured separately during the preparation process. For example, the base adhesive film layer 10 is extruded and cast, and the insulating layer 20 and the conductive layer 30 are both arranged on a fixed region on the base adhesive film layer 10 by means of screen printing, ink-jet printing, intaglio printing, coating, and other processes, and are in a grid shape. The conductive portions of the conductive layer 30 are arranged inside the grids, and the insulating layer are arranged above the grid lines.

Of course, as shown in FIG. 2, the insulating layer 20 and the base adhesive film layer 10 are of an integrated structure, and may be manufactured integrally during the preparation process. For example, the base adhesive film layer 10 and the insulating layer 20 are extruded and cast at the same time using the same material, a patterned roll is provided with fixed patterns, and the size corresponds to the size of the cell pieces, so that the insulating layer 20 has a recess structure corresponding to the regions of the cell pieces, and the depth of the recess is 5-50 microns. The conductive layer 30 is arranged in each recess region by means of screen printing, ink-jet printing, intaglio printing, coating, and other processes, so as to ensure that an anti-PID layer does not overflow after lamination.

In addition, preferably, a side of the grid line away from the base adhesive film layer 10 further has a plurality of pits, conductive materials are arranged in the pits in one-to-one correspondence, and the conductive materials are in contact with cell pieces to be arranged above the conductive layer 30. In this way, it is equivalent to adding conductive material portions arranged in the pits to the grid line portions (between the cell pieces). By arranging the conductive material portions in the pits, it is also advantageous to reduce or even eliminate the above interconnection bars and/or bus bars in the conventional art, thereby reducing the weight of the assembly, since the respective current of the cell pieces needs to be concentrated and delivered by, for example, interconnection bars and bus bars. The specific size of the above pits can be adjusted according to the gaps between the cell pieces, the thickness of the adhesive film, etc. Preferably, the depth of the pits is 30-300 µm, and the thickness of the conductive materials arranged in the pits is 20-650 µm. In this way, on the one hand, the conductive materials are arranged more stably and can be combined with the adhesive film more tightly and firmly, and on the other hand, it is advantageous to promote the conductive materials to better perform the current conduction between the cell pieces.

Figure 4:
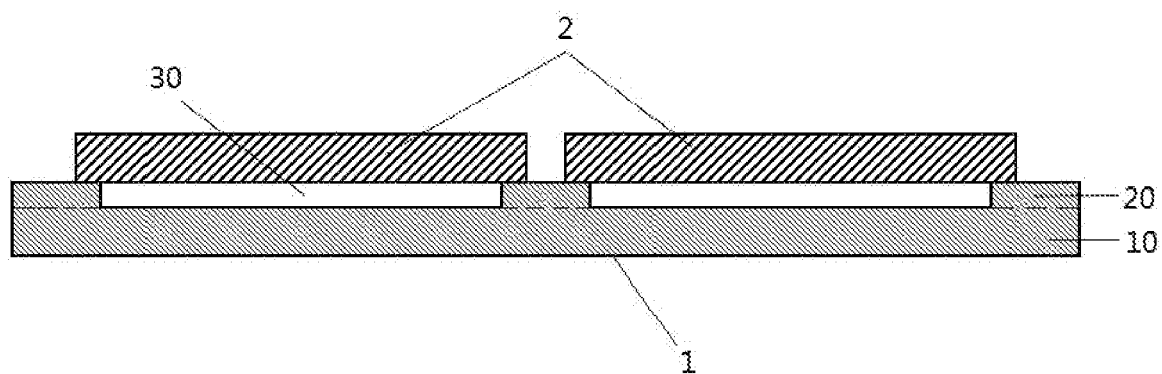
FIG. 4 shows a schematic structure diagram of a photovoltaic module according to an embodiment of the present disclosure.

According to another aspect of the present disclosure, a photovoltaic module is further provided. As shown in FIG. 4, the photovoltaic module includes an encapsulation adhesive film 1 and cell pieces 2. The encapsulation adhesive film 1 is the above anti-PID encapsulation adhesive film, and grid lines in an insulating layer 20 in the anti-PID encapsulation adhesive film are arranged corresponding to gaps between the cell pieces 2.

Preferably, a side of the grid line away from the base adhesive film layer further has a plurality of pits, conductive materials are arranged in the pits in one-to-one correspondence, and the conductive materials are in contact with cell pieces to be arranged above the conductive layer. Preferably, the depth of the pits is 30-300 µm, and the thickness of the conductive materials arranged in the pits is 20-650 µm.

Preferably, there are a plurality of cell pieces, the plurality of cell pieces are divided into at least one group of cell strings, each of the cell strings includes a plurality of cell pieces, the cell pieces in each cell string are connected by interconnection bars, and the conductive materials arranged in the pits are connected to each interconnection bar at least partially. In this way, the conductive materials in the pits at this time can act as bus bars, collecting and further delivering the current conducted by each cell string.

The present application is described in further detail below with reference to specific embodiments, which are not to be construed as limiting the scope of the claimed application.

Embodiment 1

A photovoltaic module as shown in FIG. 1 is prepared, which includes an encapsulation adhesive film and cell pieces. The specific preparation process is as follows:

An insulating layer and a base adhesive film layer are of an integrated structure. The base adhesive film layer (having a thickness of 500 microns) and the insulating layer (having a thickness of 30 microns) are extruded and cast at the same time using the same material. A patterned roll is provided with fixed patterns, and the size corresponds to the size of the cell pieces, so that the insulating layer has a recess structure corresponding to the regions of the cell pieces, and the depth of the recess is 30 microns. A mixture of a base resin and conductive filler of the conductive layer is arranged in each recess region by means of screen printing, so as to ensure that an anti-PID layer does not overflow after lamination.

The individual layer materials and performance results are shown in Table 1.

Embodiment 2

The preparation process is the same as Embodiment 1, some materials are different, and the performance results are shown in Table 1.

Embodiment 3

The preparation process is the same as Embodiment 1, some materials are different, and the performance results are shown in Table 1.

Embodiment 4

The preparation process is the same as in the above embodiments, except that: the insulating layer and the base adhesive film layer are of a non-integrated structure, the base adhesive film layer is cast into a film first, and the insulating layer and the conductive layer are respectively arranged on the base adhesive film layer by means of screen printing. Some materials are different, and the performance results are shown in Table 1.

Embodiment 5

The preparation process is the same as in the above embodiments, except that: the insulating layer and the base adhesive film layer are of a non-integrated structure, the base adhesive film layer is cast into a film first, and the insulating layer and the conductive layer are respectively arranged on the base adhesive film layer by means of screen printing. Some materials are different, and the performance results are shown in Table 1.

Comparative Example 1

The encapsulation adhesive film is only one layer of EVA adhesive film, and the performances are shown in Table 1.

Comparative Example 2

The encapsulation adhesive film is only one layer of POE adhesive film, and the performances are shown in Table 1.

Performance Characterization: the photovoltaic modules (double-sided PERC modules) manufactured in Embodiments 1 to 5 and Comparative Examples 1 to 2 were subjected to a power test (backside power) followed by a PID test; and after 192 hours of PID, the power was tested and compared to an initial power, and the degradation rate was calculated. The PID test was performed according to IEC TS 2804-1: 2015, and the test conditions were tightened to 85° C., 85% RH, and a negative constant direct current voltage of 1500V. The results of the embodiments and the comparative examples are as follows.

TABLE 1

| Embodiment | Base adhesive film | Insulating layer | Whether to be integrally formed | Conductive layer resin | Filler | Filter ratio | volume resistivity of conductive layer Ω-cm | Initial power | PID |
|---|---|---|---|---|---|---|---|---|---|
| 1 | EVA | EVA | Yes | Acrylate | Silver nanowire | 0.5% | 95.23 | 275.6 | 3.1% |
| 2 | POE | POE | Yes | Polyurethane | Silver nanowire | 20% | 0.07 | 275.3 | 0.1% |
| 3 | EVA | EVA | Yes | Epoxy resin | Carbon nanotube | 1% | 12.24 | 275.7 | 1.3% |
| 4 | EVA | EVA | No | Polyurethane | Silver-coated copper particle | 5% | 3.71 | 275.5 | 0.4% |
| 5 | POE | POE | No | Acrylate | Silver-coated copper particle | 10% | 0.55 | 275.6 | 0.2% |
| Comparative example 1 | EVA adhesive film | / | / | / | / | / | / | 275.8 | 20.5% |
| Comparative example 2 | POE adhesive film | / | / | / | / | / | / | 275.4 | 8.9% |

In order to make those skilled in the art better understand the solutions of the present disclosure, the technical solutions in the embodiments of the present disclosure will be clearly and completely described below with reference to the drawings in the embodiments of the present disclosure. It is apparent that the described embodiments are only a part of the embodiments of the present disclosure, not all of the embodiments. On the basis of the embodiments of the present disclosure, all other embodiments obtained on the premise of no creative work of those of ordinary skill in the art should fall within the scope of protection of the present disclosure.

It is to be noted that the specification and claims of the disclosure and the terms "first", "second" and the like in the drawings are used to distinguish similar objects, and do not need to describe a specific sequence or a precedence order. It will be appreciated that data used in such a way may be exchanged under appropriate conditions, in order that the embodiments of the present disclosure described here can be implemented. In addition, the terms "include" and "have", as well as any variations thereof, are intended to cover a non-exclusive inclusion. For example, a process, method, system, article, or device that includes a list of steps or units is not necessarily limited to those steps or units expressly listed, but may include other steps or units not expressly listed or inherent to such process, method, article, or device.

As described in the Background, the weight aspect of the photovoltaic module in the conventional art depends on several elements of photovoltaic glass, encapsulation adhesive films, silicon wafers, solder strips (interconnect and bus bars), backplanes, and frames. The weight of photovoltaic glass depends on the thickness, and cannot be reduced excessively under the premise of ensuring performance. Similarly, the weight of encapsulation adhesive films, silicon wafers and backplanes cannot be reduced excessively. In order to reduce the weight of a photovoltaic module, the applicant of the present disclosure provides a photovoltaic module. As shown in FIGS. 5 to 8, the photovoltaic module includes: a first transparent substrate 100, a first encapsulation adhesive layer 200, a cell piece layer 300, a second encapsulation adhesive layer 400, and a second transparent substrate 500, which are stacked. The first encapsulation adhesive layer 200 and/or the second encapsulation adhesive layer 400 include a base material layer 110 and conductive layers 120. Pluralities of pits are provided on one side surface of the base material layer 110. The conductive layers 120 are arranged in the pits, and the conductive layers 120 are in contact with the cell piece layer 300.

In order to collect electric current, the photovoltaic module in the conventional art usually needs to use interconnection bars to connect cell pieces and bus bars to connect cell strings composed of cell pieces. The above interconnection bars and the bus bars are located between a cell piece layer and an encapsulation adhesive layer. However, the photovoltaic module in the present disclosure can eliminate the above interconnection bars and/or bus bars in the conventional art by providing a base material layer of a sealing adhesive layer with pits and arranging conductive materials in the pits and in contact with the cell piece layer, thereby reducing the type of photovoltaic modules.

Moreover, the interconnection bars and bus bars in the conventional art are usually formed by plating copper cores with tin and covered on the cell piece layer by manual welding. However, the arrangement of the conductive layer in the photovoltaic module according to the present disclosure does not require a welding process, thereby not only reducing the production cost of the photovoltaic module, but also reducing the manual labor consumption during the production of the photovoltaic module.

Moreover, with regard to the photovoltaic module in the conventional art, if water vapor invades the module, acetate ions and the like are easily hydrolyzed in the encapsulation adhesive film, this would have a corrosion effect on metals such as copper in a solder strip. However, the conductive layer used in the present disclosure may be an organic conductive material, so that the risk of corrosion of the module can be reduced.

In addition, since the conventional solder strip bus bar may have a certain thickness, and the thickness of an encapsulation material laminated at this position may be reduced, so that the protective effect exerted by the encapsulation material may be weakened, resulting in an increased risk of corrosion. However, the conductive layer in the present disclosure is well-integrated with the adhesive film and can constitute an integrated product, so that the protective effect of the encapsulation adhesive layer on the conductive layer can be improved.

In the above photovoltaic module of the present disclosure, the conductive layers 120 are filled in the pits of the base material layer 110, and the conductive layers 120 may be flush with the upper surfaces of the pits, protrude from the upper surfaces of the pits, or slightly below the upper surfaces of the pits. Preferably, the depth of the pits in the above base material layer 110 is 30-300 μm; also, preferably, the thickness of the conductive layers 120 is 20-650 μm. By allowing the base material layer 110 and the conductive layers 120 to meet the above conditions, the conductive layers 120 can be arranged to protrude from the pits, so that the conductive layers 120 and the base material layer 110 are combined more tightly and firmly, thereby reducing the risk of the conductive layers 120 detaching from the base material layer 110 of the encapsulation adhesive layer.

A person skilled in the art would have been able to rationally select the conductive materials for forming the above conductive layers 120 according to the conventional art. In order to improve the conductive performance, conductive materials forming the conductive layers are preferably selected from any one or more of copper foil, aluminum foil, and conductive organic and conductive inorganic compounds.

In the above photovoltaic module of the present disclosure, the base material layer 110 may have a low fluidity to ensure tearing, stretching or wrinkling due to adhesive film flow during lamination. Preferably, adhesive film materials forming the above base material layer 110 are EVA and/or POE. Also, preferably, the base material layer 110 has a thickness of 290-800 μm. Too thin base material layer 110 may result in poor encapsulation effect of the module, and too thick base material layer 110 may result in increased cost of the module.

In consideration of convenience and cost in practical production, in a preferred implementation, the thickness of the base material layer 110 is 500 μm, the depth of the pits is 100 μm, and the thickness of the conductive layers 120 is 200 μm, that is, the ratio of the base material layer 110, the conductive layer 120 to the thickness of the pits is 5:2:1.

In an optional embodiment, the cell piece layer 300 includes a plurality of cell pieces 301, and the conductive layers 120 are connected to each cell piece 301 at least partially. The first encapsulation adhesive layer 200 and/or the second encapsulation adhesive layer 400 is as shown in FIG. 6. The above conductive layers 120 can collect the current in the cell pieces 301 to the bus bars and lead out the current through the bus bars instead of the interconnection bars connecting the respective cell pieces 301 in the conventional art.

In the above embodiment, in order to improve the efficiency of collecting current, it is more preferable that the arbitrary cross-section of the pits has a minimum length of 5-300 mm and a minimum width of 0.2-1.5 mm.

In an optional embodiment, the cell piece layer 300 includes a plurality of cell strings, each of the cell strings includes a plurality of cell pieces 301, the cell pieces 301 in each cell string are connected by interconnection bars, and the conductive layers 120 are connected to each interconnection bar at least partially. The first encapsulation adhesive layer 200 and/or the second encapsulation adhesive layer 400 is as shown in FIG. 7. The above conductive layers 120 can collect and lead out the current collected by the interconnection bars in the cell pieces 301 of each cell string instead of the bus bars connecting the respective cell strings in the conventional art.

In the above embodiment, in order to improve the efficiency of collecting current, it is more preferable that the arbitrary cross-section of the pits has a minimum length of 300-900 mm and a minimum width of 6-20 mm.

In another optional embodiment, the cell piece layer 300 includes a plurality of cell strings, each of the cell strings includes a plurality of cell pieces 301, the conductive layer 120 includes first conductive portions and second conductive portions, the first conductive portions are connected to the cell pieces 301 in each cell string at least partially, and the second conductive portions are connected to each first conductive portion at least partially. The first transparent substrate 100 provided with the first encapsulation adhesive layer 200 and the cell pieces 301 on the surface is as shown in FIG. 8. The above first conductive portions can collect the current in the cell pieces 301 instead of the interconnection bars connecting the cell pieces 301 in the conventional art. The above second conductive portion can collect and lead out the current collected by the first conductive portions in the cell pieces 301 of each cell string instead of the bus bars in the conventional art.

In the above photovoltaic module of the present disclosure, the base material layer 110 may be provided with a first wire lead-out hole 600. As shown in FIG. 7, the wire lead-out hole 600 corresponds to a second wire lead-out hole provided in the second transparent substrate 500, so that a bus bar (or a conductive layer 120 serving as a bus bar) can be led out of the second transparent substrate 500 via the first wire lead-out hole 600 and the second wire lead-out hole, and is connected to a junction box. A silicone adhesive can be used between the junction box and the second transparent substrate 500, and a potting adhesive is used to fill the inside of the junction box.

According to another aspect of the present disclosure, a manufacturing method for the above photovoltaic module is also provided, including: a step of stacking the first transparent substrate 100, the first encapsulation adhesive layer 200, the cell piece layer 300, the second encapsulation adhesive layer 400, and the second transparent substrate 500. The step of preparing the first encapsulation adhesive layer 200 and/or second encapsulation adhesive layer 400 includes: forming a plurality of pits on one side surface of the base material layer 110, and arranging the conductive layer 120 in the pits.

In the above manufacturing method of the present disclosure, the above interconnection bars and/or bus bars in the conventional art can be eliminated by providing a base material layer of a sealing adhesive layer with pits and arranging conductive materials in the pits and in contact with the cell piece layer, thereby reducing the type of photovoltaic modules. Moreover, the arrangement of the conductive layer in the above manufacturing method does not require a welding process, thereby not only reducing the production cost of the photovoltaic module, but also reducing the manual labor consumption during the production of the photovoltaic module, and reducing the risk of corrosion of the module.

After the step of forming the pits and before the step of arranging the conductive layer 120 in the pits, the manufacturing method of the present disclosure may further include a step of pre-crosslinking the base material layer 110. By the above pre-crosslinking, not only the fluidity of the surface of the adhesive film forming the base material layer 110 can be reduced to prevent the adhesive film from overflowing, but also the lamination with the conductive layer 120 can be facilitated, so that the pits do not excessively deform due to the lamination with the conductive layer 120. In addition, it can be ensured that the conductive layer 120 does not excessively displace during lamination of the first encapsulation adhesive layer 200 and/or the second encapsulation adhesive layer 400. Preferably, the pre-crosslinking degree of the surface of the base material layer 110 is 5%-65% by the above pre-crosslinking.

In order to arrange the conductive layers 120 in the pits, in a preferred implementation, the surface of a patterned roll is coated with a conductive material, the surface of the patterned roll has a first adhesion force to the conductive material, the patterned roll is used to form the pits in the surface of the base material layer 110, the conductive material is adhered to the pits at least partially to form the conductive layer 120 while forming the pits, the base material layer 110 has a second adhesion force to the conductive material, and the second adhesion force is greater than the first adhesion force. With the above preferred implementation, the conductive layers 120 can be arranged therein while forming pits, thereby improving the process efficiency.

In the above preferred implementation, a person skilled in the art would have been able to perform a surface treatment on the patterned roll according to the type of the conductive materials so as to have a required first adhesion force, or to perform a surface treatment on the base material layer 110 according to the type of the conductive materials so as to have a required second adhesion force, so that the second adhesion force is greater than the first adhesion force.

In another preferred implementation, a conductive material is adsorbed on the surface of a patterned roll by a first adsorption force, the pits are formed on the surface of the base material layer 110 by the patterned roll, and the adsorption of the conductive material is released while the pits are formed, so that the conductive material is transferred into the pits, or the conductive material is adsorbed on a side of the base material layer 110 away from the patterned roll by a second adsorption force, the second adsorption force being greater than the first adsorption force. With the above preferred implementation, the conductive layers 120 can also be arranged therein while forming pits, thereby improving the process efficiency.

In the above preferred implementation, the surface of the patterned roll may be coated with a material having an adsorption force to adsorb the conductive materials to the surface thereof, and then the conductive materials may be adsorbed into the pits using an adsorption device on the other side opposite to the surface of the base material layer 110 for forming the pits.

From the above description, it can be seen that the above embodiments of the present disclosure achieve the following technical effects:

1. The photovoltaic module in the present disclosure can eliminate the above interconnection bars (and/or bus bars) in the conventional art by providing a base material layer of a sealing adhesive layer with pits and arranging conductive materials in the pits and in contact with the cell piece layer, thereby reducing the type of photovoltaic modules.

2. The arrangement of the conductive layer in the photovoltaic module according to the present disclosure does not require a welding process, thereby not only reducing the production cost of the photovoltaic module, but also reducing the manual labor consumption during the production of the photovoltaic module, and reducing the risk of corrosion of the module.

The above is only the preferred embodiments of the present disclosure, not intended to limit the present disclosure. As will occur to those skilled in the art, the present disclosure is susceptible to various modifications and changes. Any modifications, equivalent replacements, improvements and the like made within the spirit and principle of the present disclosure shall fall within the scope of protection of the present disclosure.

What claimed is:

1. An anti-Potential Induced Degradation (PID) encapsulation adhesive film for a photovoltaic module comprising a plurality of photovoltaic cells comprising gaps between the photovoltaic cells, comprising:
   a base adhesive film layer;
   an insulating layer, located on one side surface of the base adhesive film layer, the insulating layer having a grid structure comprising grid lines and a plurality of hollow portions defined by the grid lines, and the grid lines having a structure corresponding to gaps between the photovoltaic cells; and
   a conductive layer, comprising a plurality of conductive portions, the conductive portions being arranged in the hollow portions in one-to-one correspondence, and the volume resistivity of the conductive portions being less than 100 Ω·cm;
   wherein, the width of the grid lines is greater than the width of the gaps between the photovoltaic cells.

2. The anti-Potential Induced Degradation (PID) encapsulation adhesive film according to claim 1, wherein the conductive portion has a shape adapted to the photovoltaic cell, and surface of the conductive portion away from the base adhesive film layer is flush with the surface of the insulating layer.

3. The anti-Potential Induced Degradation (PID) encapsulation adhesive film according to claim 1, wherein the conductive layer has a thickness of 5-50 μm.

4. The anti-Potential Induced Degradation (PID) encapsulation adhesive film according to claim 1, wherein the conductive layer comprises a resin base material and conductive filler dispersed in the resin base material.

5. The anti-Potential Induced Degradation (PID) encapsulation adhesive film according to claim 4, wherein the conductive filler is one or more of carbon nanotubes, nano-silver powder, nano-silver wire, silver-coated copper particles, or silver-coated nickel particles.

6. The anti-Potential Induced Degradation (PID) encapsulation adhesive film according to claim 4, wherein the weight of the conductive filler is 0.5-20% of the weight of the resin base material.

7. The anti-Potential Induced Degradation (PID) encapsulation adhesive film according to claim 1, wherein the materials of the insulating layer and the base adhesive film layer are independently selected from one or more of EVA, POE, and PVB, respectively.

8. The anti-Potential Induced Degradation (PID) encapsulation adhesive film according to claim 1, wherein the insulating layer and the base adhesive film layer are of an integrated structure.

9. The anti-Potential Induced Degradation (PID) encapsulation adhesive film according to claim 1, wherein a side of the grid line away from the base adhesive film layer further has a plurality of pits, conductive materials are arranged in the pits in one-to-one correspondence, and the conductive materials are in contact with cell pieces to be arranged above the conductive layer, preferably, the depth of the pits is 30-300 μm, and the thickness of the conductive materials arranged in the pits is 20-650 μm.

* * * * *